(12) United States Patent
Auger et al.

(10) Patent No.: US 9,297,070 B2
(45) Date of Patent: Mar. 29, 2016

(54) CHEMICAL VAPOR DEPOSITION REACTOR FOR DEPOSITING LAYERS MADE OF A REACTION GAS MIXTURE ONTO WORKPIECES

(75) Inventors: Michael Auger, Mels/SG (CH); Renato Bonetti, Winznau (CH); Hristo Strakov, Olten/So (CH)

(73) Assignee: IHI Ionbond AG, Olten (CH)

( * ) Notice: Subject to any disclaimer, the term of this patent is extended or adjusted under 35 U.S.C. 154(b) by 1302 days.

(21) Appl. No.: 13/055,155

(22) PCT Filed: Jul. 21, 2009

(86) PCT No.: PCT/EP2009/059360
§ 371 (c)(1),
(2), (4) Date: Apr. 25, 2011

(87) PCT Pub. No.: WO2010/010088
PCT Pub. Date: Jan. 28, 2010

(65) Prior Publication Data
US 2011/0185973 A1    Aug. 4, 2011

(30) Foreign Application Priority Data
Jul. 23, 2008    (DE) .................. 10 2008 034 330

(51) Int. Cl.
| C23C 16/44 | (2006.01) |
| C23C 16/34 | (2006.01) |
| C23C 16/36 | (2006.01) |
| C23C 16/455 | (2006.01) |
| C23C 16/458 | (2006.01) |
| C23C 16/448 | (2006.01) |

(52) U.S. Cl.
CPC ............. *C23C 16/4412* (2013.01); *C23C 16/34* (2013.01); *C23C 16/36* (2013.01); *C23C 16/4488* (2013.01); *C23C 16/4584* (2013.01); *C23C 16/45578* (2013.01)

(58) Field of Classification Search
CPC ..................... C23C 16/4412; C23C 16/45578; C23C 16/4488; C23C 16/34; C23C 16/36; C23C 16/4584
See application file for complete search history.

(56) References Cited

U.S. PATENT DOCUMENTS

| 4,745,088 A | 5/1988 | Inoue et al. |
| 4,926,793 A * | 5/1990 | Arima et al. .................. 118/730 |
| 5,324,540 A | 6/1994 | Terada |
| 5,441,570 A | 8/1995 | Hwang |

(Continued)

FOREIGN PATENT DOCUMENTS

| EP | 0164928 | 12/1985 |
| EP | 0270991 | 6/1988 |

(Continued)

*Primary Examiner* — Jeffrie R Lund
(74) *Attorney, Agent, or Firm* — Dinsmore & Shohl LLP

(57) ABSTRACT

The invention relates to a CVD-reactor for depositing layers made of a reaction gas onto workpieces. Said reactor comprises an elongate, vertical reaction chamber that is defined by a reactor wall and a reactor base, an inlet line for guiding the reaction gas into the reaction chamber, entering into the region of the reactor base in the reaction chamber, a central outlet line that guides the used reaction gas out of the reaction chamber and that extends out of the reactor chamber in the region of the reactor base, a tier-like workpiece receiving element that is arranged in a central manner in the reaction chamber and can be rotated about the central axis thereof.

12 Claims, 4 Drawing Sheets

(56) References Cited

U.S. PATENT DOCUMENTS

| | | | |
|---|---|---|---|
| 5,782,980 A * | 7/1998 | Allen et al. | 118/715 |
| 5,863,843 A | 1/1999 | Green et al. | |
| 6,265,026 B1 * | 7/2001 | Wang | 427/248.1 |
| 6,355,107 B1 * | 3/2002 | Solomon et al. | 118/726 |
| 2005/0095770 A1 * | 5/2005 | Kumagai et al. | 438/202 |
| 2006/0063391 A1 * | 3/2006 | You et al. | 438/771 |
| 2006/0159847 A1 | 7/2006 | Porter et al. | |
| 2007/0010072 A1 | 1/2007 | Bailey et al. | |
| 2007/0246355 A1 | 10/2007 | Toyoda et al. | |
| 2009/0042404 A1 * | 2/2009 | Surthi | 438/770 |
| 2010/0326357 A1 * | 12/2010 | Huang | C23C 16/45578 118/724 |
| 2011/0185973 A1 * | 8/2011 | Auger | C23C 16/34 118/724 |

FOREIGN PATENT DOCUMENTS

| | | |
|---|---|---|
| EP | 0572150 | 12/1993 |
| GB | 2379450 | 3/2003 |
| JP | 2002289536 A | 10/2002 |

* cited by examiner

CHEMICAL VAPOR DEPOSITION REACTOR FOR DEPOSITING LAYERS MADE OF A REACTION GAS MIXTURE ONTO WORKPIECES

CROSS-REFERENCE TO RELATED APPLICATIONS

This application is the U.S. National Phase of PCT/EP2009/059360 filed Jul. 21, 2009, which claims priority of German Patent Application DE 10 2008 034 330.7 filed Jul. 23, 2008.

FIELD OF THE INVENTION

The present invention relates to a CVD (chemical vapor deposition) reactor for use in the vapor-phase deposition of coatings, in particular hard material coatings, onto workpieces and the surfaces thereof.

The expressions "vapor-phase deposition" and "CVD" (from the English expression "chemical vapor deposition") are generally used as synonyms. They relate to a method for generating layers, in particular thin layers, on the surfaces of other materials (substrates) such as, for instance, workpieces for metal processing (for example cutting tips, saw blades, etc). Vapor-phase deposition is characterized in that chemical reactions of the chemical compounds contained in the reaction gas take place, and the desired main products of the chemical reactions are deposited on the surface of the substrate, forming a layer or coating thereon. Possible reaction by-products accumulate in gaseous form and must be removed from the gas mixture in order to ensure the layer properties. This occurs by way of an exhaust gas line that either conveys the gases into the atmosphere via a gas scrubber or supplies the gases to the neutralization process via a vacuum pump. Working under vacuum enables good process control even in rapid reactions and, thanks to low dwelling times, equalizes the reduction in layer thickness in the direction of flow that is due to the decrease in concentration (depletion).

The present invention relates in particular to a tubular reactor that is in particular a hot-wall reactor. In other words, the present invention relates to a CVD reactor in which the chemical (for example thermal) reactions can take place at a temperature (of the reaction gas) of more than 720° C. The deposition temperatures are preferably between 800 and 1200° C. The CVD reactor of the present invention therefore differs from reactors for semiconductor coating, in which the temperatures are mostly lower than 500° C.

BACKGROUND OF THE INVENTION

CVD reactors of the type mentioned above are well known in the prior art. The invention thereby takes as a starting point a CVD reactor such as is shown in FIG. 3. The shown CVD reactor comprises a cylindrical, vertical reactor chamber 10 that is delimited by a reactor wall 11 and a reactor base 12. The reactor wall 11 is dome-shaped and comprises a hollow cylindrical section and a dome 14 facing away from the reactor base. A plurality of heaters 1 to 4 are provided along the reactor wall 11, by means of which the reactor wall 11 can be heated. Suitable end parts 15 can be found in the upper and lower regions. The reactor is therefore basically disposed in a homogeneously heated space 16.

The shown CVD reactor furthermore comprises a central inlet line 17 for the continuous inflow of reaction gas. The central inlet line is formed by a central pipe that can be rotated via a drive 18. Downstream of the site where the inlet line 17 passes through the reactor base 12, a preheating chamber 19 is integrated in the inlet pipe, which chamber is formed by a container that has flow diversions and/or baffles (not shown) provided therein. Downstream of the preheating chamber 19 a plurality of gas outlets 20 are provided in the central inlet pipe.

A centrally arranged, tiered workpiece receiving element 21 is furthermore disposed in the reactor chamber 10. It comprises a plurality of tray-shaped receiving elements that are arranged one above the other. The tiers are respectively formed between two receiving elements. The gas outlets 20 of the central inlet pipe 17 are each arranged at the level of a tier and open out into the respective tier above the workpiece tray. At their radially outer end, the respective tiers are in fluid connection with the reactor chamber 10. An end plate 22 is furthermore provided above the uppermost tier.

The central inlet pipe 17 that can be rotated by means of the drive 18 is rotatably mounted in the tiered workpiece receiving element 21.

Furthermore, an outlet line 23 passes through the reactor base 12 and forms an outlet for used reaction gas out of the reactor chamber 10.

There are several problems with respect to this solution. On the one hand, the preheating chamber 19 has limits with respect to its surface that comes into contact with the inflowing reaction gas, i.e. if the preheating chamber per se is not supposed to be enlarged, the surface can only be enlarged with difficulty and combined with the integration of further flow-impeding baffles. Efforts are being made to increase the amount of inflowing gas (reaction gas) and to thereby shorten the coating process and/or to keep the thickness of the layer within narrow limits over the reactor volume. However, if the amount of gas is increased, the heating capacity of the preheating chamber must also be increased. Furthermore, part of the reactive gas mixture is prematurely consumed on the inner surfaces.

Furthermore, owing to the flow diversions in the preheating chamber the speed of the reaction gas is reduced. As a result, there is the added problem that in the preheating chamber a certain deposition process already occurs on the surfaces of the preheating chamber. This is a problem in particular in the case of reaction gases that contain Lewis acids and Lewis bases. Deposition problems are often encountered therewith. One example is the system TiCl4/CH3CN. The preheating chamber that is disposed in the rotatable central inlet pipe 17 and that rotates therewith is complex to dismantle and take apart since the premature coating welds the parts of the chamber together, and thus cleaning of the preheating chamber, i.e. the removal of the deposits in the preheating chamber, is problematic and time-consuming. In the case of very reactive gas mixtures, a thick layer formation can occur locally which, in extreme cases, leads to blockages.

Finally, it is also difficult with the preheating chamber to precisely regulate and control the temperature of the gases to be preheated. Another major disadvantage is that all reactive gases must be mixed prior to the rotating preheating chamber.

As is apparent from FIG. 3, the reaction gas is fed into the central inlet pipe 17 via a stationary gas inlet that is connected to the reactor base 12. The central inlet pipe 17 is rotated by means of the drive 18. This results in an interface between the stationary gas inlet and the central inlet pipe 17. This interface is formed in the region of the reactor base 12 and causes considerable problems in particular as regards sealing so that the escape of reaction gas at said interface and thus out of the reactor cannot be completely avoided in particular owing to the support of the seal at the specified high temperatures. This is a serious problem especially in the case of highly reactive, in particular corrosive starting substances.

When using starting products with low vapor pressures, this point must be heated to temperatures of greater than 200° C., which requires an expensive and complex technique for sealing the rotating duct.

Known CVD reactors do not provide any solutions to the aforementioned problems. DD 111 935 discloses, for example, the downward introduction of a reaction gas via a central inlet pipe that is provided with gas outlets and that enters the reactor chamber in the region of the reactor lid. It is furthermore proposed herein to cool the central inlet line. The latter is in stark contrast to the specification to preheat the reaction gas before introduction into the reactor chamber. Furthermore, DD 111 935 explicitly teaches a flow outwards from the central inlet pipe towards the reactor wall so as to prevent an increased deposition rate on the reactor wall.

DE 197 43 922 proposes the continuous switching of the flow of reaction gas into the reactor chamber. Therein, the reaction gas flows outside a central pipe, over the workpieces to be coated, into the central pipe via an opening in the central pipe that is facing away from the reactor base and then out of the reactor, or—after switching—the reaction gas flows in the reverse direction upwards through the central pipe, out of the opening facing away from the reactor base and from there downwards over the workpieces to be coated and out of the reactor chamber. A relatively complex two-way valve arrangement that has to withstand high temperatures is provided herefor, and furthermore, the integration of gas preheating and mixing before coating of the workpieces is difficult, in particular when reactants with low vapor pressures are present, since the preheating would have to be carried out at different outlets depending on the different valve positions.

EP 0 164 928 A2 relates to a vertical hot-wall CVD reactor having two parallel inlet and outlet lines disposed in the edge regions, said lines passing through the base of the reactor into the reactor chamber and extending from there up to the uppermost tier of a tiered workpiece receiving element. The workpiece receiving element is rotatably mounted. The substrates to be coated are thereby supposed to be placed in the centre of the rotational axis of the workpiece receiving element and thus precisely centrally between the inlet and outlet lines.

US 2006/0159847 A1 comprises two inlet pipes that presumably extend through the base and from there up to the uppermost tier of a workpiece receiving element. The workpiece receiving element itself is not rotatable. The inlet lines can rather be rotated about 360°, and the workpiece receiving element is herein also supposed to be arranged centrally between the inlet and the outlet.

US 2007/0246355 A1 also discloses an inlet line that extends from the base up to the uppermost tier as well as an outlet line in the region of the base. A rotatable workpiece receiving element is furthermore provided.

With respect to EP 0 270 991 B1, a stationary inlet line is arranged centrally, i.e. in the middle relative to the reactor chamber and is surrounded by a rotatable outlet line.

Furthermore, two workpiece receiving elements are disposed to the left and right of the inlet and outlet line and are accommodated in an inner reactor chamber that is in turn surrounded by an outer reactor chamber. The central outlet line is rotatable. If this outlet line is rotated, the base plate rotates therewith and takes with it the workpiece receiving elements such that these workpiece receiving elements rotate about the outlet line. Owing to this rotation and to the fact that the toothed wheels engage with the fixed toothed wheel, the workpiece receiving elements themselves rotate about their central axes.

DE 78 28 466 U1 relates to the coating of workpieces, in particular tools. A central inlet line is rotated here, but not, however, the stationary workpiece receiving element.

SUMMARY OF THE INVENTION

In view of the statements made above, the object of the present invention is therefore to further develop the CVD reactor described above in connection with FIG. 3 in such a manner that larger amounts of gas can flow in whilst maintaining consistent layer properties and a consistent homogeneity (layer thickness) so as to provide a uniform yet more rapid coating of the workpieces as compared to the prior art and to reduce the sealing problems.

This object is solved by a CVD reactor having the features of patent claim 1. Advantageous further developments of the present invention are mentioned in the sub-claims.

The idea forming the basis for the present invention is to introduce the reaction gas into the reactor chamber preferably substantially parallel to, in any case in the vicinity of the heated reactor wall such that the large surface of the reactor wall can be used to preheat the reaction gas. In order to maintain homogeneity and the other layer properties as compared to the prior art, the tiered workpiece receiving element is furthermore rotated in accordance with the invention.

The CVD reactor of the present invention comprises an elongated, vertically-extending reactor chamber that is delimited by an at least partially heatable reactor wall and a reactor base. It is preferred for the reactor chamber to be cylindrical, preferably with a circular cross-section (octagonal, polyhedral or other cross-sections are also conceivable). The reactor wall can thereby be composed of, for example, a hollow-cylindrical part and a dome sealing one end of the hollow cylinder. The reactor base is provided at the other end of the hollow cylinder. Furthermore, the CVD reactor according to the invention comprises one or more inlet lines for the inflow, in particular continuous inflow, of the reaction gas into the reactor chamber. The inlet line thereby enters the reactor chamber in the region of the reactor base, preferably though the reactor base. Also provided is a preferably central outlet line for the preferably continuous outflow of the used reaction gas (which thus includes both the unconverted educts and the reaction products) out of the reactor chamber, said outlet line also exiting the reactor chamber in the region of the reactor base, preferably through the reactor base. Furthermore, a tiered workpiece receiving element that is arranged preferably centrally in the reactor chamber is rotatable around its central axis, in this case preferably the central axis of the preferably central outlet line and, where applicable, of the reactor chamber. In this case, tiered means that one or more trays or tables can be provided, which, when arranged vertically one above the other, each form a tier and accommodate the workpieces to be coated in a horizontal position. They are also to be understood as frames that accommodate the workpieces in a hanging manner. It is apparent from this arrangement that the inlet line is disposed between the central outlet line, more precisely the tiered workpiece receiving element, and the heatable reactor wall such that the gas flows directly or indirectly along the reactor wall and is sufficiently preheated by the heat radiated by the reactor wall. Owing to this arrangement and to the larger surface of the reactor wall as compared to the preheating chamber, a more rapid heating can be achieved as compared to the use of the preheating chamber, and thus larger amounts of gas are able to flow in without reducing the flow rate by means of baffles and/or diversions. As mentioned above, baffles and/or diversions are associated with considerable deposition problems, in particular if Lewis acids and Lewis bases are present as starting substances. All in all, the resulting advantage is that a quicker coating can take place, whereby owing inter alia to the rotation of the tiered workpiece receiving element the homogeneity and other layer properties are at least consistent as compared to the prior art. Furthermore, the inner surface of the reactor wall is a substantially smooth surface which, as compared to the preheating chamber, is easily accessible and thus easy to clean and which also does not require time-intensive and complex dismantling. By attaching easily exchangeable "baffle plates" the availability of CVD systems can also be improved since no long cleaning periods between two batches are required. That is to say, the "baffle plates" are simply exchanged during cleaning. Furthermore, a good temperature control of the reaction gas over the entire height of the CVD reactor is possible, in particular if a plurality of heating elements that can be regulated separately are provided, which leads to a more uniform and more homogeneous layer distribution over the workpieces arranged in the various tiers. As described above, sealing an interface with rotating elements is difficult and thus complex. In the present invention, the tiered workpiece receiving element is rotated whereas the central outlet line is stationary. The inlet line is also stationary. There is thus substantially no interface between gas-carrying elements in the region of the reactor base, at least one of which rotates.

In particular so as to reduce deposition on the reactor wall, it is particularly advantageous, optionally independently of the rotation of the tiered workpiece receiving element, to design the inlet line as a pipe that extends parallel to the heatable part of the reactor wall, for example parallel to a portion of the hollow cylindrical part or the entire hollow cylindrical part of the reactor wall. The pipe can be made of heat transmitting material in order to already preheat the gas or gases in the inlet line, or it can be made of heat-insulating material (see below).

It is furthermore advantageous if the inlet pipe extends from the reactor base substantially up to the uppermost tier of the workpiece receiving element and possibly also beyond, or at least up to the vicinity of the uppermost tier. This makes it possible to minimize in a particularly simple manner the length of the path leading to the workpieces to be coated that is taken by the reaction gas following its exit from the inlet pipe and at the same time to keep the distance to the reactor wall small so as to configure preheating in an optimal manner.

Based on this design, there are a number of implementation possibilities which are also combinable.

For example, it is advantageous if at least one opening per tier of the workpiece receiving unit is provided in the inlet pipe in line with the opening of the respective tier, and the tiers are radially accessible (there is a fluid connection between the reactor chamber and the tiers) so that reaction gas can flow out of the openings of the inlet pipe, radially along the tiers, i.e. over and past the workpieces to be coated, up to the central outlet flow.

The openings can thereby be directed towards the reactor wall so that the reaction gas flows (can flow) against the reactor wall and undergoes additional preheating, after which it can flow along the substrate (workpiece) up to the outlet line taking the shortest path. Undesirable deposits from side reactions with impurities in the reaction gas mixture are deposited on the hot reactor wall, more specifically on the "baffle plates". Coatings with a high-quality surface finish can thereby be generated.

In order to be able to achieve a flow that is as laminar as possible and thus a uniform gassing of the workpieces, it is furthermore preferred for the outlet line to be a pipe that extends centrally from the reactor base to the uppermost tier and that comprises at least one opening per tier, at the level of the respective tier, for the inflow of the used reaction gas into the outlet pipe. That is to say, the outlet pipe comprises at least one opening per tier in order to create the fluid connection between the tiers and the outlet pipe.

Alternatively or in addition to the above embodiment, the inlet pipe can be open at its end facing away from the reactor base, i.e. in the region of the uppermost tier. Openings are thereby preferably provided in an end plate that closes the workpiece receiving element at its end facing away from the reactor base so that the reaction gas can flow out of the opening of the inlet pipe, through the opening in the end plate in the direction of the reactor base and out of the reactor chamber via the central outlet line. For this purpose, the outlet pipe may, as described above, be designed with openings provided in the outlet pipe from the reactor base to the uppermost tier, or it may be shorter and abut in a funnel shape the bottommost tier in the region of the bottommost tier and extend from there to the reactor base.

The outlet pipe can be provided with bore holes or openings that are of equal size, equally spaced or adapted specifically to the coating task in order to optimize the flows.

In the case of the latter design alone, it is furthermore advantageous if the reaction gas only comes into contact with the reactor wall in the region of the dome. The reactor dome could, for example, be detachable from the hollow cylindrical section of the reactor wall so that this part can be cleaned separately. The workpiece receiving element is also rotated in this embodiment.

When using a preheating chamber such as described in connection with FIG. 3, the following additional problem exists. In some CVD processes, the reactive species in the gas phase only form at higher temperatures. In the reactor shown in FIG. 3, this occurs in the preheating chamber, accompanied by the already described problems with depositions in particular on the baffles and diversions. According to the invention, it is therefore advantageous to provide a plurality of (in particular two or three) said inlet lines, via which a plurality of different reaction gases can flow separately into the reactor chamber and mix in the reactor chamber to form the actual reaction gas. That is to say, the mixing of the plurality of reaction gases to form the reaction gas does not take place until the reactor chamber, i.e. after leaving the inlet lines, whereby, as mentioned above, the path between the inlet line or lines and the workpieces is small such that the region in which deposits can form is also small. For the sake of simplicity, the gases that flow through the plurality of inlet lines and mix to form the actual reaction gas are also referred to as "reaction gases" in the present description even though they should be more precisely referred to as "starting gases" that mix in the reactor chamber to form the actual reaction gas. For their part, the starting gases can in turn consist of a gas mixture also containing, for example, inert gases such as nitrogen or argon. However, they are preferably single gases with a suitable purity.

The inlet line can preferably comprise a plurality of channels made of heat-insulating material (for example, ceramic). This allows the gases and vapors to be supplied in a relatively cold state, followed by a rapid mixing in the hot area in the direct vicinity of the material to be coated.

A very well controlled process is ensured in this manner, in which undesirable side reactions are avoided.

In particular in the embodiment in which the inlet line is open at its end facing the reactor base, it is therefore advantageous to define a mixing area in the reactor chamber that is defined between the end plate and the dome, so that the mixing of the plurality of reaction gases (starting gases) to form the reaction gas can take place in this mixing space.

In the embodiment having the plurality of openings along the length of the inlet pipe at the level of the respective tiers, it is advantageous if the inlet lines comprise corresponding openings at the same level and the openings are so orientated, for example are facing one another or are directed at the same region of the reactor wall or baffle plates, that the outflowing reaction gases collide with one another and a good mixing of the gases and rapid bonding (reaction gas) occurs without lengthening the path to the workpieces that has the associated problem of depositions on undesired surfaces.

In order to be able to achieve rotation of the workpiece receiving element in the simplest mechanical manner, it is advantageous for the workpiece receiving element to have internal toothing in the region of the reactor base, with which a driven toothed wheel engages so as to rotate the workpiece receiving element. The toothed wheel may be a spur gear and the internal toothing may be a ring gear. However, other designs and other drives are also conceivable. An electromotor is preferably used as the drive, the speed of which can be infinitely variable such that the tiered workpiece receiving element is rotatable in the range of 1 to 10 rotations per minute. The direction of rotation can be reversible to prevent an agglomeration of possibly accumulating contaminations by alternating the direction of rotation.

Furthermore, one or more reaction gas generators may advantageously be integrated in the inlet line in the region of the reactor base and disposed in the reactor chamber. Such a reaction gas generator may be, for example, an evaporator unit in which the initially liquid starting product or reaction product is vaporized. Purely by way of an example, a metal chloride generator can alternatively be mentioned, in which, for example, HCl or $Cl_2$ (or metal halide $MX_n$) flows through a metal so as to form a metal chloride that is finally introduced into the reactor chamber via the inlet line. The integration of these evaporator units or metal chloride generators or reaction gas generators in general into the reactor chamber leads to the advantage that no additional sealing problems arise. It can furthermore be advantageous for these reaction gas generators to be heated and regulated separately (reactor temperature decoupling).

It may furthermore be preferred to be able to remove the tiered workpiece receiving element from the reactor either together with or separately from the central outlet line so that after a concluded process, the workpiece receiving element can simply be replaced by a new one with newly loaded workpieces, thereby keeping the idle time of the CVD reactor low. The outlet line can hereby be tightly coupled and decoupled by means of, for example, a detachable coupling, and sealing between the workpiece receiving element and the reactor base can occur, where necessary, via a labyrinth seal, i.e. a non-contact seal.

In addition, it can be advantageous to also determine the temperature in the inlet and/or outlet line, and thus a sensor can be integrated in each of these lines. These additional temperature measurements lead to a further improved process control.

Furthermore, a module for cleaving and/or decomposing and/or activating gases (such as hydrocarbons, nitrogen-hydrogen compounds and organometallic compounds) for the reactions in the reactor chamber 10 can be integrated in the inlet line 34.

Further advantages and features of the present invention are apparent from the following description of preferred embodiments.

BRIEF DESCRIPTION OF THE DRAWINGS

The description of the preferred embodiments is carried out with reference to the accompanying drawings, in which.

DESCRIPTION OF THE PREFERRED EMBODIMENTS

For the sake of simplicity, identical or similar elements are provided with the same reference numbers in the various drawings.

Figure 1:
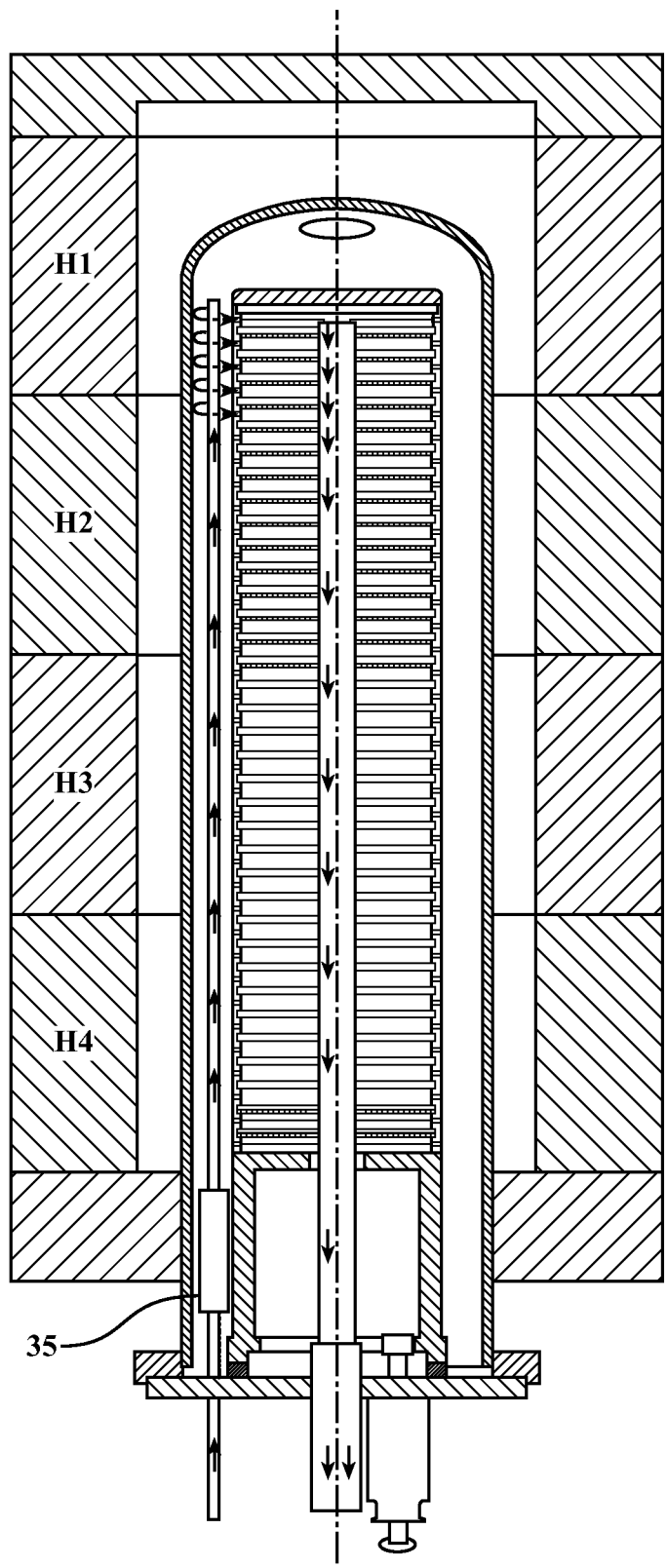
FIG. 1 shows a schematic drawing of a first embodiment of a CVD reactor according to the invention.

The CVD reactor of the first embodiment, which is shown in FIG. 1, comprises a cylindrical and vertical reactor chamber 10. This reactor chamber 10 is delimited by the reactor base 12 and the reactor wall 11, with the reactor wall 11 being composed of a hollow cylindrical section 13 and a dome 14.

A tiered workpiece receiving element 21 is accommodated centrally in the reactor chamber 10 (the central axis M of the reactor chamber and the workpiece receiving element are congruent) and extends over substantially the entire height of at least the hollow cylindrical section 13 of the reactor wall 11. If the reactor is configured with reaction generators in the reactor chamber 10, the workpiece receiving element and the later described outlet pipe 31 can also be accommodated off-centre. The tiered workpiece receiving element is composed of a plurality of parallel and horizontally arranged tray-shaped receiving elements 25, on which the workpieces or substrates to be coated can be placed. Each of the receiving elements 25 defines a tier. Circumferential walls 24 that connect the receiving elements 25 are disposed between the individual receiving elements 25. These circumferential walls which, as described below, are provided with inflow openings 26 can also be replaced by individual webs that connect the receiving elements 25 provided that the respective tiers, more precisely the spaces formed between two adjacent receiving elements 25, are radially in fluid connection with the reactor chamber. An end plate 22 is provided at the end of the uppermost tier, which defines the final space in which a workpiece can be placed, namely the space between the uppermost receiving element 25 and the end plate 22. A support 27 is attached to the lowermost tier, which comprises a ring gear 28 with internal toothing in the region of the reactor base 12. The toothing of a spur gear 29 that is driven by the drive 18 engages with this internal toothing of the ring gear 28. The support 27 is rotatably mounted on the reactor base 12 by means of, for example, ceramic slide bearing 30 or by means of rollers or ball bearings. A further bearing can take place in the region of the later described outlet pipe 31, however this is not shown in FIG. 1. Owing to a rotation of the spur gear 29 and the engagement of the spur gear 29 with the internal toothing of the ring gear 28, the tiered workpiece receiving element 21 can be rotated in the reactor chamber 10 about the central axis M of the ring gear 28. The number of rotations is thereby dependent in particular on the number of inflow openings 26 in the outer walls 24 of the tiers and is preferably in the range of between 1 and 10 rotations per minute, and with, for example, two holes per tier is 4 rotations per minute. The drive 18 is preferably infinitely variable such that the speed of rotation of the tiered workpiece receiving element can be adapted as desired and the same drive can also be used for different embodiments.

The reactor wall 11 of the shown CVD reactor is surrounded by a heater that is composed of heating elements 1 to 4 (not necessarily 4 heating elements have to be provided. Less (1) or more (>4) may be provided) and forms a space 16 surrounding the reactor wall 11. The individual heating elements can be regulated separately, with the output gradually increasing from heater 1 to heater 4. As a result of this separate regulation, an optimum temperature distribution in the reactor chamber 10 and thus an optimal preheating of the reaction gases can be set.

As is apparent from FIG. 1, a narrow clearance is formed between the outer circumference of the tiered workpiece receiving element 21 and the reactor wall 11. A gas inlet pipe 34 is provided in this clearance. The inlet pipe 34 passes through the reactor base 12 into the reactor chamber in a region of the reactor base 12 that is disposed radially outwards relative to the central axis M. The inlet pipe 34 is designed in terms of length and height such that it extends up to the uppermost tier of the workpiece receiving element 21 and a little bit beyond. The upper end of the inlet pipe 34 substantially ends at the lower surface of the end plate 22. Along the length of the inlet pipe 34 an outflow opening 36 is provided at each tier. As is apparent from the arrows in FIG. 1 that represent the flow of the reaction gas, these outflow openings 36 are directed towards the reactor wall 11 such that the outflowing reaction gas impinges upon the reactor wall. The reactor wall 11 is heated up and warmed by the elements 1 to 4 such that it on the one hand radiates heat into the reactor chamber 10 and on the other hand is itself hot. The reaction gas that flows out of the openings 36 and impinges upon the reactor wall 11 is thereby preheated to the desired reaction temperature. The inlet pipe 34 is stationary, and thus no sealing problems arise at the site where it passes through the reactor base 12 and a simple seal is possible. The cross-section of the inlet pipe 34 is so dimensioned that the rate of the inflowing reaction gas is such that a premature reaction and deposition in the inlet pipe 34 or on the inner surface thereof is prevented. However, the rate is at the same time selected such that sufficient preheating occurs via heating elements 1 to 4 that heat the reactor wall 11. It is also conceivable to introduce several (for example two or three) different reaction gases (starting gases) into the reactor chamber 10 via a corresponding number of separate inlet lines 34 that should extend parallel to one another. This is advantageous in particular in the case of gases that are to be mixed at temperatures of greater than 200° C. to form the reaction gas, whereby mixing is, however, not supposed to take place until just before the workpieces to be coated. It is thereby advantageous for the outflow openings 36 of the inlet pipes 34 to be facing one another or to be directed at the same point of the reactor wall 11.

An outlet pipe 31 is furthermore arranged centrally in the reactor chamber 10 (the central axis M of the outlet pipe is congruent with the central axis M of the reactor chamber) and is also stationary in the present embodiment so that it is easy to seal the site of passage through the reactor base 12. A corresponding seal (not shown) is provided for this purpose in this interface region. With its central axis congruent with the central axis of the tiered workpiece receiving element 21, the outlet pipe 31 extends upwards from the reactor base 12 into the uppermost tier, more specifically into the space between the uppermost receiving element 25 and the end plate 22. The inlet pipe 31 is open at its upper end 33. Furthermore, at least one but preferably more openings 32 (preferably at least two) are provided in the inlet pipe 31 at each tier. Used reaction gas (the unreacted starting gases and by-products of the reactions forming the basis for vapor-phase deposition) can flow through these inflow openings 32 into the central outlet pipe 31. The used reaction gas flows out of the uppermost tier, through the upper opening 33 and into the outlet pipe 31. The used reaction gas flows out of the reactor chamber 10 via the outlet pipe 31.

The operation of the embodiment shown in FIG. 1 will be explained in the following. The direction of flow of the reaction gas is thereby shown by the arrows in this figure.

The inflowing reaction gas or gases are introduced into the inlet pipe 34 and flow along the inlet pipe 34. The reactor wall 11 that is heated by heating elements 1 to 4, in particular in hollow cylindrical section 13, leads to a heating of the inlet pipe 34 such that preheating of the gas already occurs as it flows through the inlet pipe 34. The reaction gas furthermore flows out of the inlet pipe 34 via outflow openings 36 and, as already mentioned, impinges upon the reactor wall 11, as a result of which a further preheating to the required reaction temperature takes place. It must be mentioned in this regard that in a CVD reactor according to the invention, the reaction gas for the chemical deposition preferably reaches a temperature of greater than 800° C. The examples described below are also to be taken into consideration in this respect.

Following impingement on the reactor wall 11, the reaction gas is diverted ("rebounds") and flows radially from the inner surface of the reactor wall 11 in the direction of the central axis M. The reaction gas thereby flows through the openings 26 in the outer wall 24 of the workpiece receiving element 21, which are arranged between two adjacent receiving elements 25 and open out into the space that forms the respective tiers and that is formed between two adjacent receiving elements 25. That is to say, the reaction gas flows into the space, on the base of which (lower receiving element 25) a workpiece to be coated is disposed. Owing to the vapor-phase deposition, the gaseous substances from the reaction gas are deposited on the surfaces of the workpiece, which can be, for example, cutting tips, saw blades, etc., and form the desired layer. The used reaction gas then flows through the inlet openings 32 of the outlet pipe 31 as well as through the end opening 33 of the outlet pipe 31 into the outlet pipe 31 and out of the reactor chamber 10. During this entirely continuous inflow and outflow process, the tiered workpiece receiving element 21 is rotated about the central axis M of the ring gear 28 by the drive 18 of the toothed wheel 29. In the preferred embodiment, two holes are provided in the circumference of the wall 24 of the workpiece receiving element and the workpiece receiving element 21 is rotated at 4 rotations per minute.

Figure 3:
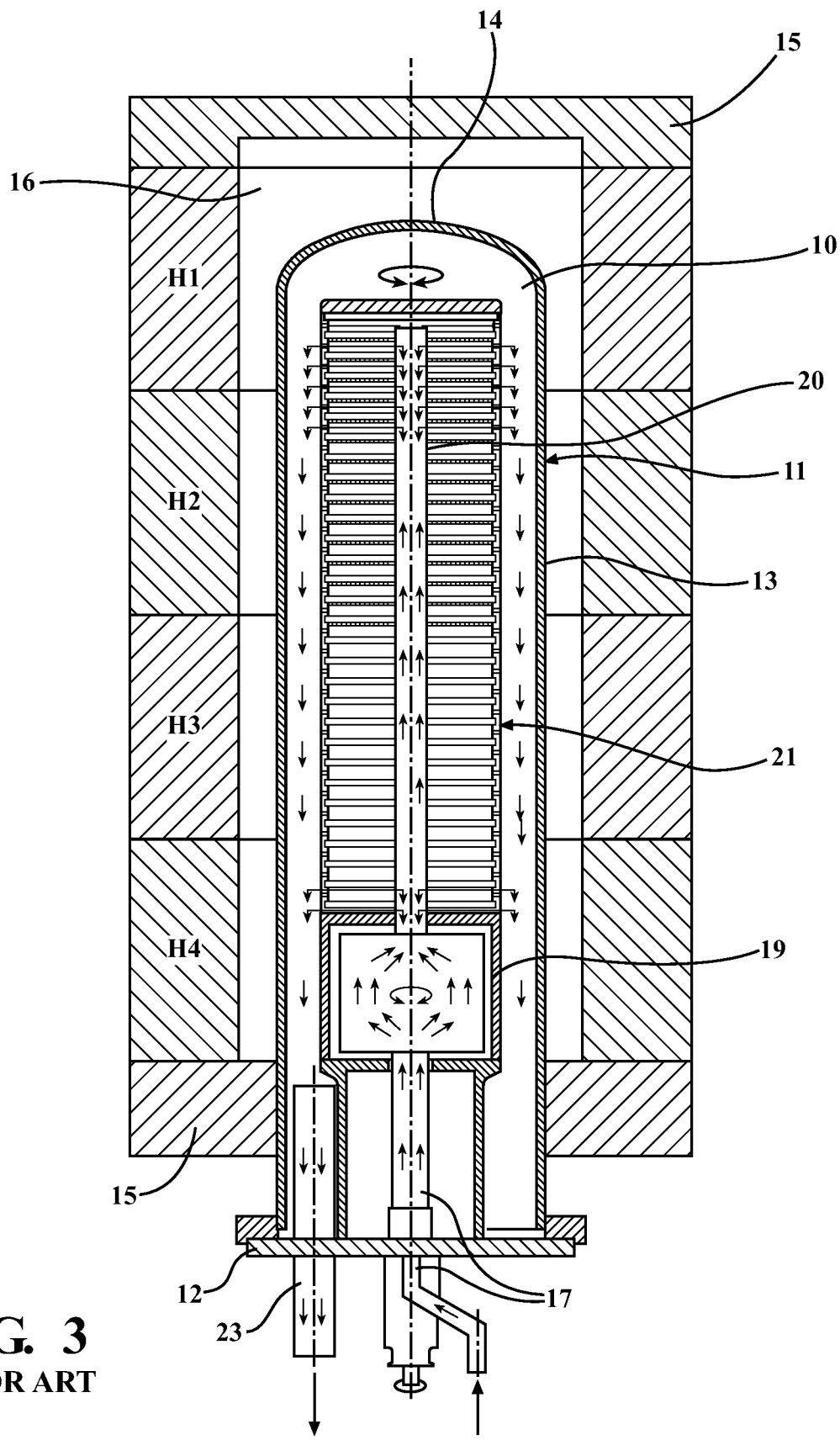
FIG. 3 shows a schematic drawing of a CVD reactor that forms the starting point for the present invention.
Figure 4:
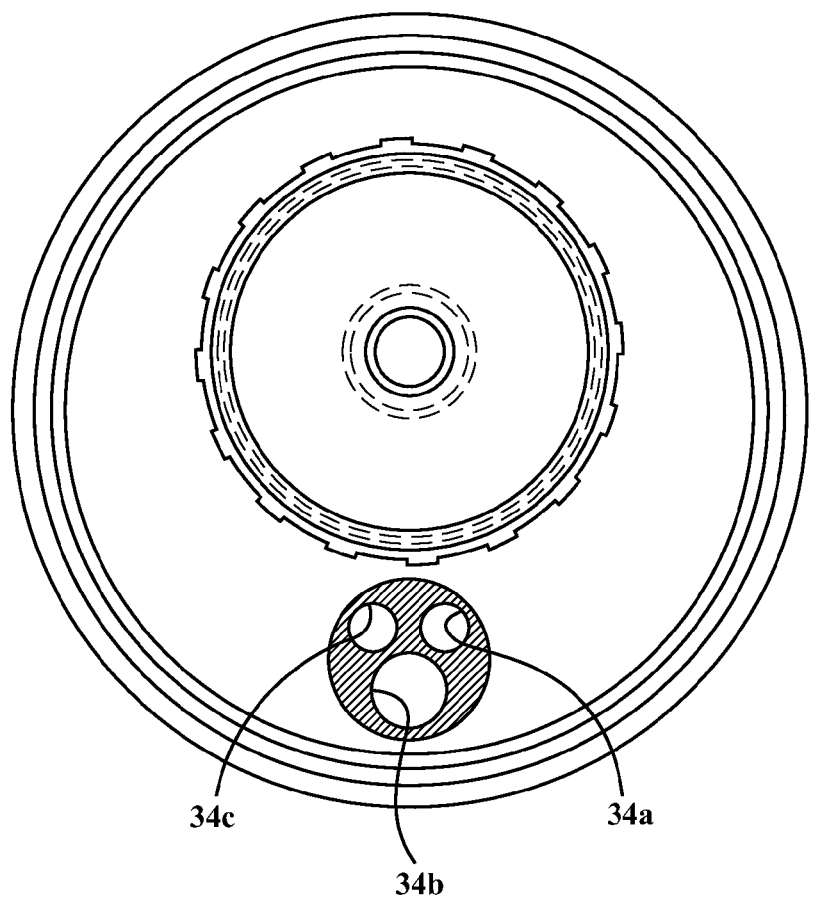
FIG. 4 shows a schematic drawing of the bottom portion of a CVD reactor according to the present invention illustrating a gas inlet having a plurality of separate inlet lines.

Since the dwelling time of the reaction gases in the lower region of the inlet pipe 34 is shorter, i.e. the time available for heating to the reaction temperature is shorter than for a gas that flows out of the uppermost outflow opening 36 and serves to gas a workpiece in the upper tier, the output of the heater 4 is greater than the output of heater 1 in order to be able to provide the respectively required heat. Owing to the separate regulation of the heating elements it is possible to optimally heat the reaction gases. Adaptations can furthermore be carried out in order to achieve the smallest possible deposition of the reaction gas on undesired surfaces. The latter is furthermore also controlled by adapting the speed of the reaction gas in the inlet pipe 34. Owing to this embodiment according to the invention, it is possible, whilst maintaining consistent homogeneity and consistent layer properties, to introduce larger amounts of gas over the same period of time and to thus accelerate the coating process. The coating costs are thereby significantly reduced. Furthermore, in the shown embodiment, the reaction gas only comes into contact with the reactor wall 11 in selected areas and then only briefly. The path between the outflow openings 36 and the workpieces is otherwise kept short so that depositions on undesired surfaces, i.e. not on the workpieces to be coated, in particular on the reactor wall 11, can be reduced. An additional deposition on the inner wall of the inlet pipe 34 can be controlled by setting a "high" flow rate of the reaction gas when flowing through the inlet pipe 34. According to the invention, it is generally preferred for the flow rate of the reaction gas or plurality of starting gases to be in the laminar range. The dwell time of the reaction gas in the reactor is normally in the second range. The rotation of the workpiece receiving element 21 furthermore leads to a coating that is largely homogeneous and that retains the layer properties as compared to the embodiment in FIG. 3.

Figure 2:
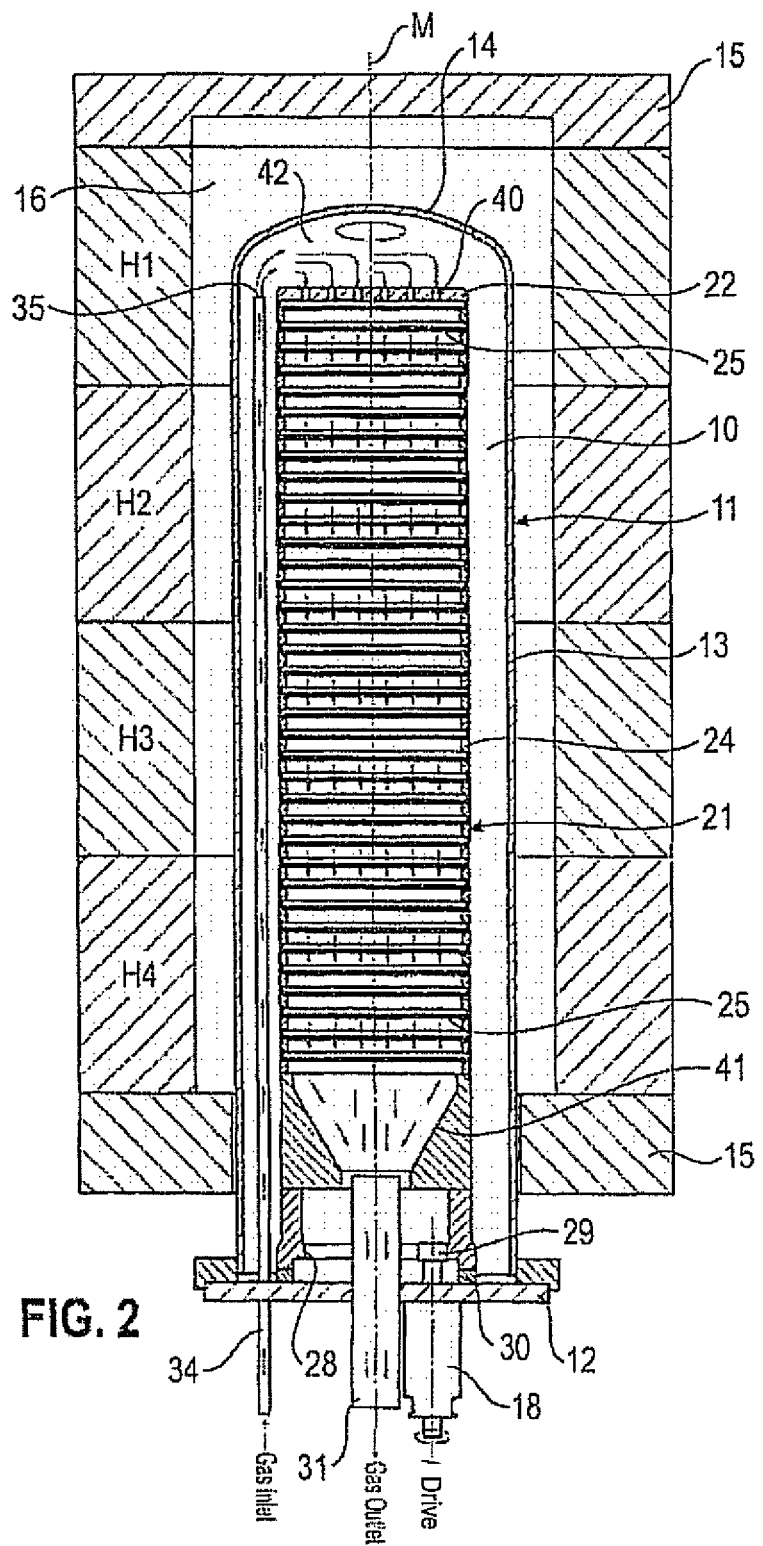
FIG. 2 shows a schematic drawing of a second embodiment of a CVD reactor according to the invention.

A second embodiment of the present invention is shown in FIG. 2. In order to avoid repetition, identical elements have not been described again. It is furthermore noted at this point that the embodiments of FIGS. 1 and 2 can also be combined. That is to say, the inlet pipe 34 of the embodiment in FIG. 1 can additionally be open at its upper end 35 and the end plate 22 can comprise openings 40. In the embodiment of FIG. 2 on the other hand, additional outflow openings 36 can also be provided in the inlet pipe that is then designed as in FIG. 1, and inflow openings 26 can be provided in the outer wall 24 of the workpiece receiving element 21.

In the embodiment shown in FIG. 2, the inlet pipe has the same design as in FIG. 1 but with just an open end 35. The outflow openings 36 are not provided.

Furthermore, the outlet pipe 31 extends upwards through the reactor base 12 for a certain distance in the direction of the workpiece receiving element 21 and opens out into a funnel-shaped space 41 that abuts the lowermost tier of the workpiece receiving element 21, i.e. that is disposed underneath the lowermost receiving element 25. The individual receiving elements 25 are fluid-permeable, for instance are designed with a plurality of openings or in the form of a lattice. This design of the receiving elements 25 can, of course, also be applied to the embodiment in FIG. 1. Furthermore, a plurality of openings 40 are provided in the end plate 22 and a mixing space 42 is formed between the upper side of the end plate 22 and the underside of the dome 14. Owing to the rotation of the workpiece receiving element 21, movement of the reaction gas in the mixing space 42 is supported or induced.

The operation of the CVD reactor of FIG. 2 will be explained in the following. A reaction gas or, in the case of separate introduction, a plurality of reaction gases is introduced into the inlet pipe or pipes 34. Therein, the gases flow up to the opening 35 in the inlet pipe 34. The wall of the inlet pipe 34 is heated by the heat radiated by the reactor wall 11 such that the reaction gas is also heated during its flow. As already mentioned, the reactor wall 11 is heated by means of heating elements 1 to 4. At the open end 35 that is facing away from the reactor base 12, the reaction gas flows out of the inlet pipe 34 and into the mixing space 42. In the case of a plurality of separately introduced gases, these gases are mixed in the mixing space 42. Otherwise, an additional final heating of the reaction gas to the desired reaction temperature can take place in this area since also this area is additionally heated by heating element 1. The reaction gas 40 exits the mixing space 42 through the openings and flows from the uppermost tier downwards in the direction of the funnel-shaped space 41 through the individual receiving elements 25 of the workpiece receiving element 21, on which the individual workpieces are disposed. The three-dimensional workpieces are thereby coated as desired. Finally, the used reaction gas flows through the funnel-shaped space 41 that opens out into the outlet pipe 31 and out of the reactor chamber 10 via the outlet pipe 31. During this process, the workpiece receiving element 21 is continuously or intermittently rotated by the drive 18.

As already mentioned above, the embodiments in FIGS. 1 and 2 can be combined, with various combination possibilities, such as mentioned, being conceivable.

It shall also be understood that even without the rotation of the workpiece receiving element 21, the design of the inlet pipe 34, as described, leads to the specified advantages, in particular with respect to a reduced deposition on undesirable surfaces. In other words, the arrangement of the inlet pipe along the heatable reactor wall 11 is a separate aspect of the invention that can also be implemented independently of the possibility of rotating the tiered workpiece receiving element. It is only important in this regard that the length of the inlet pipe 34 is such that sufficient preheating of the reaction gas before gassing of the workpieces is possible and furthermore that the shortest possible path to the workpieces is provided.

The present CVD reactor allows a reaction temperature and/or deposition temperature of greater than 720° C. It can therefore also be referred to as a medium-temperature and high-temperature CVD reactor. The CVD reactor according to the invention can be operated in this regard both under negative pressure as well as overpressure or possibly even at atmospheric pressure. Furthermore, the components of the reactor are selected such that they can withstand the high temperatures even in the presence of corrosive compounds (for example HCl), which is important in particular as regards the selection of the materials and in particular the selection of the materials for the seals and bearings.

The CVD reactor according to the invention is suitable, for instance, for the application of various CVD coatings, in particular hard material coatings, to workpieces such as blades (in particular cutting tips) and saw blades. Suitable hard materials are, for example, carbides, nitrides, carbonitrides of the transition metals titanium, tantalum, tungsten, molybdenum and chromium, borides of the ferrous metals (Ni and Fe) and oxides of aluminum, zirconium, hafnium and silicon. The CVD reactor according to the invention can be used in particular for the deposition of TiC, TiN, Ti(C,N), Cr7C3, Ni and Fe borides and Al2O3, individually or combined in layers with stepwise or continuous transitions. It shall be understood that this list is not conclusive but is rather only provided as an example.

Depending on the desired coating, the person skilled in the art will select a suitable reaction gas and introduce it into the reactor chamber 10 via an inlet line 34 or, in the case of a plurality of reaction gases (starting gases), via a plurality of inlet lines 34. In order to generate a Ti(C,N) coating on the workpieces, a reaction gas containing TiCl4, acetonitrile and hydrogen can, for example, be used.

Further examples of parameter ranges and cases of use are cited, without being conclusive, in the following:

Examples:

| Parameter unit | Range in practice | | Theoretically conceivable range | |
| --- | --- | --- | --- | --- |
| Temperature ° C. | 500 | 1100 | 200 | 1600 |
| Pressure mbar | 40 | P atm | 1 | P atm |
| Dwell time sec | 0.01 | 100 | $10^{-5}$ | $10^{4}$ |

Carrier and Reactive Gases:

Hydrogen, nitrogen, hydrocarbons, (saturated, unsaturated, aromatics) amines, ammonia, hydrazines carbon dioxide, carbon monoxide, nitrogen monoxide, silanes, boranes, halides. BC13, SiCl4, SiCl3CH3, WF6.

Starting Materials that are Liquid at Room Temperature:

TiCl4, BBr3, CH3CN, CH3OH, organometallic compounds, for example trimethylaluminum, platinum-actonylacetonate, VCl4.

Solid Compounds (Low Vapor Pressure):

CrCl2, MoCl5, TiJ4, AlCl3, HfCl4, NbCl5.

Layers:

Carbides, nitrides, oxides, borides, silicides, phosphides, the transition metals, IVB-VIIB, as well as covalent compounds of Si, N, Al, C . . . as monolayers, multi-layer coatings, gradients mixtures, inclusions, multilayers.

Base Materials:

Pure metals, alloys, steels, hard metals, super alloys, ceramics, graphites, etc.

The invention claimed is:

1. A CVD reactor for depositing layers made of a reaction gas onto workpieces, comprising:
   an elongated, vertically-extending reactor chamber that is delimited by a reactor wall and a reactor base,
   a heater for heating at least a portion of said reactor wall,
   an inlet line for the inflow of the reaction gas into the reactor chamber, said inlet line entering the reactor chamber in the region of the reactor base, said inlet line having a linear portion disposed parallel to the heatable portion of said reactor wall, and in a spaced apart relationship therewith, said linear portion having a plurality of openings defined therethrough along its length, said openings being disposed and configured so as to cause said inflow of reaction gas to impinge upon said reactor wall, whereby said reaction gas is heated by said wall,
   an outlet line for the outflow of the used reaction gas out of the reactor chamber, said outlet line having a linear portion disposed in a spaced apart, parallel relationship with the linear portion of said inlet line, said outlet line exiting the reactor chamber in the region of the reactor base, the linear portion of said outlet line having a plurality of openings defined therethrough,
   a tiered workpiece receiving element that is disposed in the reactor chamber and can be rotated about its central axis, the central axis of said workpiece receiving element and the central axis of the linear portion of the outlet line being congruent, wherein the outlet line is designed such that it is stationary and the inlet line is disposed between the workpiece receiving element and the reactor wall.

2. A CVD reactor according to claim 1, wherein the linear portion of the inlet line is dimensioned such that it extends substantially up to the uppermost tier of the workpiece receiving element.

3. A CVD reactor according to claim 2, wherein at least one opening per tier of the workpiece receiving element is provided in the inlet line in line with the respective tier, and the tiers are radially accessible so that reaction gas can flow out of the openings of the inlet line, radially along the tiers and up to the central outlet line.

4. A CVD reactor according to claim 1, wherein the outlet line is a pipe that extends centrally from the reactor base to the uppermost tier and that comprises at least one opening per tier at the level of the respective tier for the inflow of the used reaction gas into the outlet line.

5. A CVD reactor according to claim 1, wherein a plurality of inlet lines are provided, via which a plurality of different reaction gases can flow separately into the reactor chamber so as to mix in the reactor chamber to form the reaction gas.

6. A CVD reactor according to claim 5, wherein the inlet line comprises a plurality of channels made of heat-insulating material.

7. A CVD reactor according to claim 5, wherein openings formed in the inlet lines are orientated such that the outflowing reaction gases collide with one another.

8. A CVD reactor according to claim 1, wherein the workpiece receiving element comprises internal toothing in the region of the reactor base, with which a driven toothed wheel engages in order to rotate said workpiece receiving element.

9. A CVD reactor according to claim 1, wherein one or more reaction gas generators are integrated in the inlet line in the region of the reactor base and are disposed in the reactor chamber.

10. A CVD reactor according to claim 1, wherein a module for cleaving, decomposing and/or activating gases in the reactor chamber is integrated in the inlet line.

11. A CVD reactor according to claim 1, wherein the outlet line and/or the workpiece receiving element are centrally arranged.

12. A CVD reactor according to claim 1, wherein the workpiece receiving element is rotatable only about its central axis.

* * * * *